US010672768B2

(12) United States Patent
Gaynor et al.

(10) Patent No.: US 10,672,768 B2
(45) Date of Patent: Jun. 2, 2020

(54) INTEGRATED CIRCUIT WITH MULTI-THRESHOLD BULK FINFETS

(71) Applicant: Tufts University, Medford, MA (US)

(72) Inventors: Brad D. Gaynor, Newton, MA (US); Soha Hassoun, Lexington, MA (US)

(73) Assignee: Tufts University, Medford, MA (US)

( * ) Notice: Subject to any disclaimer, the term of this patent is extended or adjusted under 35 U.S.C. 154(b) by 198 days.

(21) Appl. No.: 15/127,175

(22) PCT Filed: Mar. 17, 2015

(86) PCT No.: PCT/US2015/020962
§ 371 (c)(1),
(2) Date: Sep. 19, 2016

(87) PCT Pub. No.: WO2015/142847
PCT Pub. Date: Sep. 24, 2015

(65) Prior Publication Data
US 2017/0179121 A1    Jun. 22, 2017

Related U.S. Application Data

(60) Provisional application No. 61/954,113, filed on Mar. 17, 2014.

(51) Int. Cl.
*H01L 27/088* (2006.01)
*H01L 29/78* (2006.01)
*H01L 21/8234* (2006.01)
*H01L 29/06* (2006.01)
*H01L 29/66* (2006.01)

(52) U.S. Cl.
CPC .. *H01L 27/0886* (2013.01); *H01L 21/823431* (2013.01); *H01L 29/0657* (2013.01); *H01L 29/7853* (2013.01); *H01L 29/7854* (2013.01); *H01L 29/66795* (2013.01)

(58) Field of Classification Search
None
See application file for complete search history.

(56) References Cited

U.S. PATENT DOCUMENTS

| 8,653,599 | B1 | 2/2014 | Cheng et al. | |
|---|---|---|---|---|
| 2007/0170474 | A1* | 7/2007 | Kawasaki | H01L 21/823412 257/288 |
| 2009/0267155 | A1* | 10/2009 | Izumida | H01L 29/1054 257/365 |
| 2010/0052043 | A1 | 3/2010 | Lee | |
| 2010/0270619 | A1* | 10/2010 | Lee | H01L 29/4908 257/365 |
| 2013/0043536 | A1 | 2/2013 | Rahim et al. | |

(Continued)

FOREIGN PATENT DOCUMENTS

KR    20030065864    8/2003

*Primary Examiner* — Nilufa Rahim
(74) *Attorney, Agent, or Firm* — Occhiuti & Rohlicek LLP (57) ABSTRACT

A method for manufacturing a FinFET having a fin that has a fin body includes selecting a desired electrical performance parameter, selecting a base dimension of the fin, identifying a combination of fin-body doping and fin-geometry that causes the FinFET to have the desired electrical performance parameter, doping the fin body according to the identified fin-body doping, and fabricating the fin according to the fin-geometry.

38 Claims, 4 Drawing Sheets

(56) References Cited

U.S. PATENT DOCUMENTS

| | | | |
|---|---|---|---|
| 2013/0270559 A1* | 10/2013 | Hafez | H01L 27/11206 257/50 |
| 2013/0277752 A1 | 10/2013 | Glass et al. | |
| 2015/0060959 A1* | 3/2015 | Lin | H01L 29/785 257/288 |
| 2015/0079750 A1* | 3/2015 | Wang | H01L 29/66803 438/283 |
| 2015/0228722 A1* | 8/2015 | Chung | H01L 29/0657 257/401 |

* cited by examiner

INTEGRATED CIRCUIT WITH MULTI-THRESHOLD BULK FINFETS

CROSS REFERENCE TO RELATED APPLICATIONS

This application is the national phase under 35 USC 371 of International Application No. PCT/US2015/020962, filed on Mar. 17, 2015, which claims the benefit of the Mar. 17, 2014 priority date of U.S. Provisional Application No. 61/954,113, the contents of which are hereby incorporated by reference in their entirety.

FIELD OF INVENTION

This invention relates to integrated circuits, and in particular, to design and fabrication of transistors.

BACKGROUND

A field effect transistor ("FET") typically has a doped source region and a doped drain region separated by an oppositely doped, or intrinsic, region between them. By application of a suitable field from a gate, it is possible to form a conducting channel in this region. The field strength required to form this conducting channel is sometimes called the "threshold" of the transistor.

A field effect transistor with a high threshold will tend to have low leakage current. Such transistors are desirable for use in implementing features that operate during the device's stand-by mode.

In contrast, a transistor with a low threshold will tend to have a higher drive current. These are typically used when implementing features that require high performance or that operate only when the device is actively being used.

It is apparent that a tradeoff inherently exists between these two types of transistors. A typical integrated circuit that uses planar FETs will often have both types of transistors present.

It is known how to make transistors of either type. It is also known how to make planar transistors of both types on the same integrated circuit.

A difficulty that arises is that of making planar transistors smaller. Although, in a MOSFET, one can physically make the channel between source and drain shorter, short-channel effects limit the practical channel length achievable. As a result, if the channel becomes too short it becomes difficult to turn off the transistor. This causes undesirable properties, such as high leakage current.

The difficulties can be overcome with three-dimensional transistors, such as FinFETs. In FinFETs, the gate electrode surrounds multiple sides of a vertical channel, or fin. This provides greater control over the channel, which results in lower leakage.

However, the gate electrode only surrounds those parts of the channel that protrude above the shallow trench isolation. The fin body itself is buried within the shallow trench isolation and therefore is not surrounded. This gives rise to the possibility of leakage in the fin body under the shallow trench isolation and gate induced drain leakage associated with band-to-band tunneling at the drain/body interface. It is desirable to control this leakage current.

Experimental results available in the prior art suggest that the overall shape of the fin has no effect on the leakage current, but that changing the dimension of the fin width and height does. In particular, according to the prior art, making the base of the fin smaller will reduce leakage. However, making smaller fins is difficult, and the fin width is typically fixed to the technology node.

Another method for decreasing leakage in FinFETs is to retract the source and drain implants away from the channel. A disadvantage of this method is that the transistor inevitably consumes more area on a chip. This tends to undermine one of the advantages of using a FinFET in the first place. Another disadvantage is that FinFET fabrication methods generally work best when all transistors have the same footprint. If different FinFETs require different base sizes to implement transistors having different properties, the prospect of having such FinFETs formed on the same chip becomes more difficult.

SUMMARY

The invention is based in part on the recognition that one can control the trade-off between leakage current and drive current in a FinFET by suitably controlling both doping of the fin body and the geometry of the fin above its base. Since this does not require changing the base of the fin itself, one can readily accommodate FinFETs with different thresholds on the same integrated circuit.

In one aspect, the invention features a method for manufacturing a bulk FinFET having a fin that has a fin body. Such a method includes selecting a desired electrical performance parameter for the bulk FinFET, and identifying a combination of fin parameters that causes the FinFET to have the desired electrical performance parameter. The fin parameters include a fin-body doping level and a fin-geometry. The method continues with doping the fin body according to the identified fin-body doping, and fabricating the fin according to the identified fin-geometry.

In some practices, identifying the combination of fin parameters includes identifying a fin-body doping level, and, after having identified the fin-body doping level, identifying a fin-geometry.

Other practices are the converse. In these practices, identifying the combination of fin parameters includes identifying a fin-geometry, and, after having identified the fin-geometry, identifying a fin-body doping level.

There also exist practices in which identifying fin-geometry and fin-body doping level are carried out concurrently.

The fin can be selected to have a variety of fin geometries. Practices of the invention include those in which the fin geometry is characterized by a triangular cross-section, a rectangular cross-section, and a trapezoidal cross-section. As used herein, adjectives derived from the name of an abstract geometric shape are not restricted to just that shape but include shapes that are substantially enough similar to that shape such that one of ordinary skill in the art would classify the shape as corresponding to that of a physical embodiment of that abstract geometric shape.

Thus, as used herein, a triangular cross-section would include cross-sections that have three sides that meet at a vertex. But it would also include cross-sections that have three sides that meet at a rounded corner.

With the foregoing in mind, practices of the invention include those in which identifying a fin geometry having a triangular cross-section includes identifying a fin in which the cross-section is a triangle, and those in which identifying a fin-geometry having a triangular cross-section includes identifying a fin in which the cross-section has consists of three sides, at least two of which are connected by a rounded vertex.

By extension, there are also some practices in which identifying a fin-geometry having a rectangular cross-section includes identifying a fin-geometry in which the cross-section is a rectangle, and practices in which identifying a fin having a rectangular cross-section includes identifying a fin in which the cross-section consists of a first side and a second side, both of which have a first length, and a third side and fourth side, both of which have a second length, with a first rounded vertex connecting the third side to the first side, and a second rounded vertex connecting the second side to the third side.

Among the practices of this method are those in which identifying a fin-geometry having a trapezoidal cross-section includes identifying a fin in which the cross-section is a trapezoid, and also those in which identifying a fin having a trapezoidal cross-section includes identifying a fin in which the cross-section consists of a first side and a second side, both of which have a first length, and a third side and fourth side, both of which have a second length, with a first rounded vertex connecting the third side to the first side, and a second rounded vertex connecting the second side to the third side.

A variety of electrical parameters can likewise be selected. Among the practices of the invention are those in which the electrical parameter is selected to be leakage current, drive current, a combination of leakage current and drive current, a function of leakage current, a function of drive current, or a function of both leakage current and drive current.

In some embodiments, identifying a combination of fin parameters comprises identifying a fin-geometry having a selected sidewall angle.

A variety of individual and independent ranges of sidewall angle, hereafter referred to as a "sidewall range," are within the scope of the invention. Each individual sidewall range is characterized by a range breadth and an integer. In particular, the range is defined as the set of angles between an upper bound and a lower bound, where the lower bound is defined by a product of a range breadth and a first integer and the upper bound is defined by a product of the range breadth and a second integer. The second integer is the first integer incremented by one.

In one set of individual, separate, and distinct ranges, each of which corresponds to one individual, separate, and distinct invention that is different from inventions associated with the other ranges, the range breadth is one degree and the integer varies from zero to eighty-nine, thus defining a total of ninety separate and distinct inventions. Also included within the scope of the invention is a set of ranges formed by the union of two or more ranges as defined above. Each such union defines another separate and distinct invention.

In another set of individual, separate, and distinct ranges, each of which corresponds to one individual, separate, and distinct invention that is different from inventions associated with the other ranges, the range breadth is ten degree and the integer varies from zero to eight. Also included within the scope of the invention is a set of ranges formed by the union of two or more ranges as defined above. Each such union defines another separate and distinct invention.

In another aspect, the invention features an article of manufacture that includes an integrated circuit. The integrated circuit has first and second bulk FinFETs having corresponding first and second fins. The first FinFET and second FinFET are selected to have different first and second electrical performance parameters. The first fin has a fin-geometry and fin-body doping selected to yield a transistor that has the first electrical performance parameter. The second fin has a fin-geometry and fin-body doping selected to yield a transistor that has the second electrical performance parameter.

In some embodiments, the first fin has a base dimension that is equal to a base dimension of the second fin. In other embodiments, the first fin has a first base dimension that is substantially equal to a second base dimension of the second fin. In yet other embodiments, the first fin has a first base dimension that is equal to a second base dimension of the second fin within a manufacturing tolerance that was used to make the FinFET.

In some embodiments, the first fin-geometry is different from the second fin-geometry. In others, the geometries are the same but the body doping levels are different. In yet other embodiments, the fin-body doping levels and the fin-geometries are both different.

Among the embodiments of the invention are those in which the first fin has a triangular cross-section, those in which the first fin has a rectangular cross-section, and those in which the first fin has a trapezoidal cross-section.

Among the embodiments in which the first fin has a triangular cross-section are those in which the triangular cross-section is a triangle, and those in which it consists of three sides, at least two of which are connected by a rounded vertex.

Among the embodiments in which the first fin has a rectangular cross-section are those in which the rectangular cross-section is a rectangle, and those in which it consists of a first side and a second side, both of which have a first length, and a third side and fourth side, both of which have a second length, wherein a first rounded vertex connects said third side to said first side, and wherein a second rounded vertex connects said second side to said third side.

Among the embodiments in which the first fin has a trapezoidal cross-section are those in which that cross-section is a trapezoid, and also those in which it consists of a first side and a second side, both of which have a first length, and a third side and fourth side, both of which have a second length, wherein a first rounded vertex connects said third side to said first side, and wherein a second rounded vertex connects said second side to said third side.

A variety of electrical parameters can likewise be selected. Among the practices of the invention are those in which the electrical parameter is selected to be leakage current, drive current, a combination of leakage current and drive current, or some function of either leakage current, drive current, or both.

In some embodiments, the first and second fin-geometries are characterized by different sidewall angles.

A variety of individual and independent ranges of differences between sidewall angles, hereafter referred to as a "sidewall-angle-difference ranges," are within the scope of the invention. Each individual sidewall-angle-difference range is characterized by a range breadth and an integer. In particular, the range is defined as the set of sidewall-angle differences between an upper bound and a lower bound, where the lower bound is defined by a product of a differential and a first integer and an upper bound defined by a product of the differential and a second integer. The second integer is the first integer incremented by one.

In one set of individual, separate, and distinct ranges, each of which corresponds to one individual, separate, and distinct invention that is different from inventions associated with the other ranges, the differential is one degree and the number varies from zero to eighty-nine, thus defining a total of ninety separate and distinct inventions. Also included within the scope of the invention is a set of ranges formed by the union of two or more ranges as defined above. Each such union defines another separate and distinct invention.

A manufacture within the scope of the invention also includes an electronic device that includes within it at least one integrated circuit that embodies any of the foregoing features. Thus, if a tablet-computer, a phone, or a smartphone, or a computer were to include even one integrated circuit along the lines of the foregoing, that would be included within the scope of the invention.

These and other features of the invention will be apparent from the following detailed description and the accompanying figures, in which:

DETAILED DESCRIPTION

Figure 1:
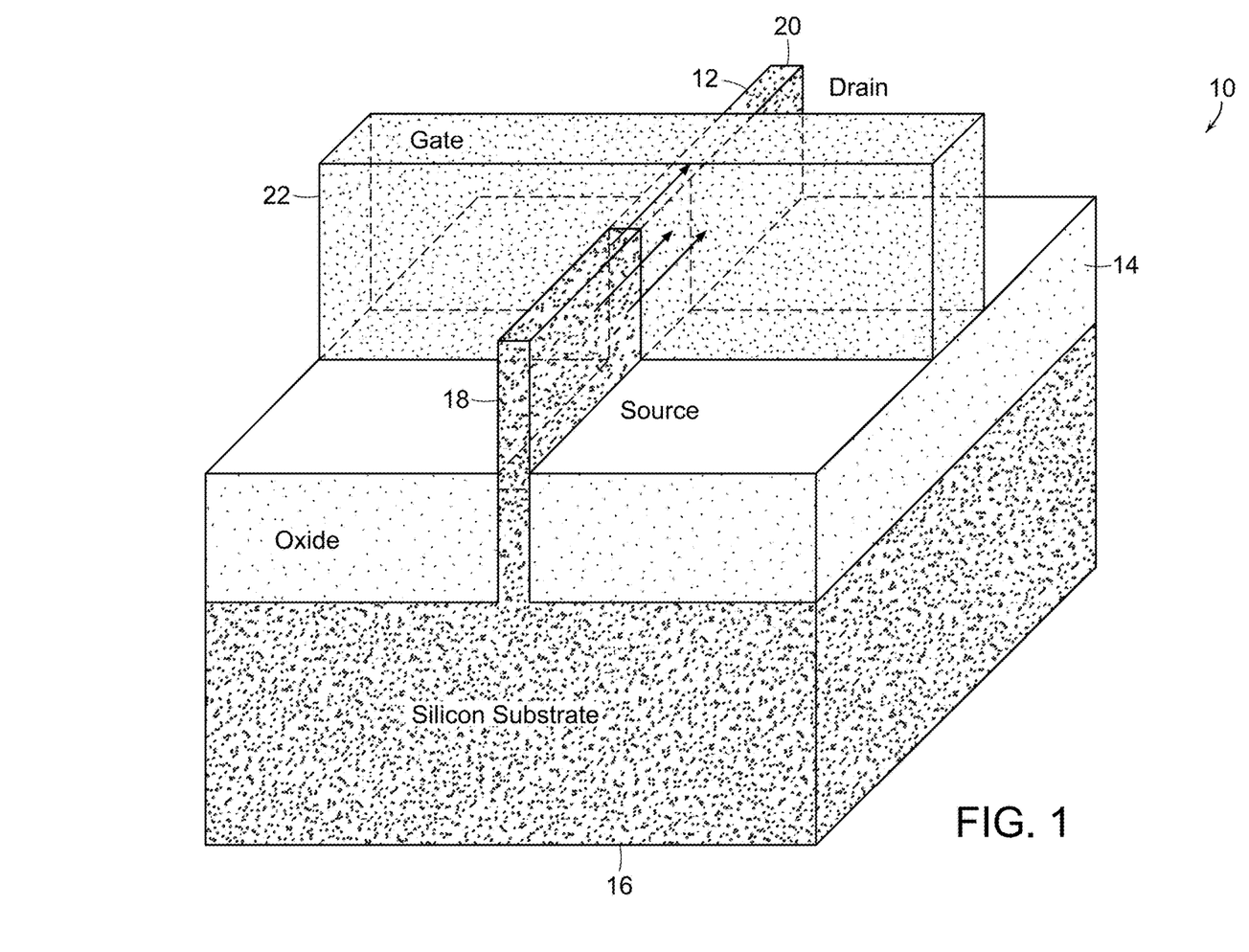
FIG. 1 is an isometric view of a typical FinFET.

Referring to FIG. 1, a typical bulk FinFET 10 features a fin 12 that protrudes through an oxide layer 14 from a substrate 16. The fin 12 has a first end doped as a source 18 and a second end doped as a drain 20. Between the source and drain is a channel, which is not shown because the sides and top of the fin 12 are covered by a gate electrode 22.

Figure 2:
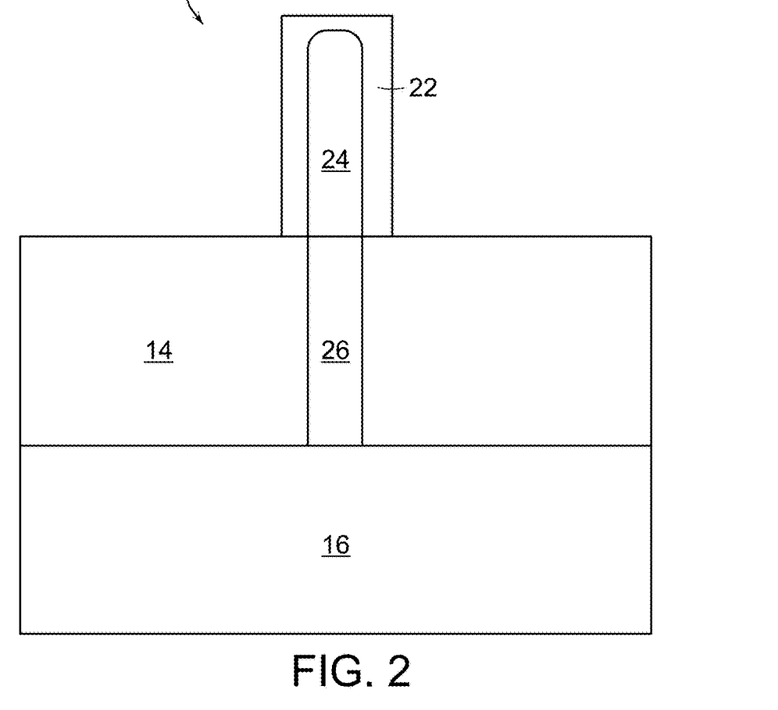
FIG. 2 is a cross-section of the FinFET of FIG. 1.
Figure 3:
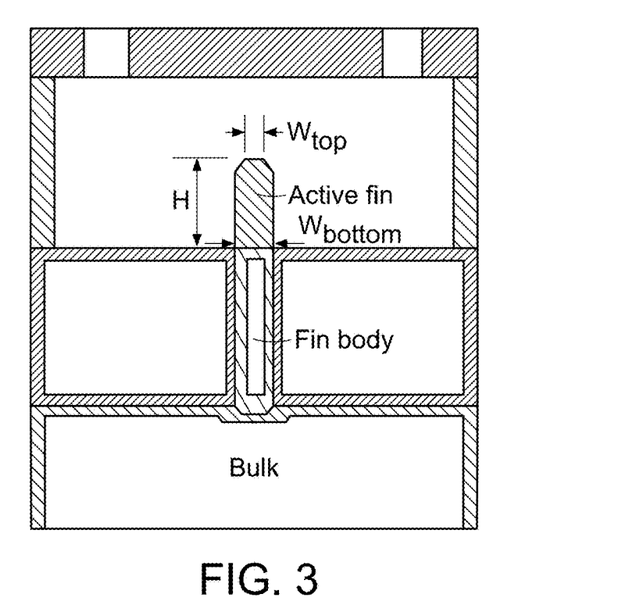
FIG. 3 shows another cross-section of a FinFET.
Figure 4:
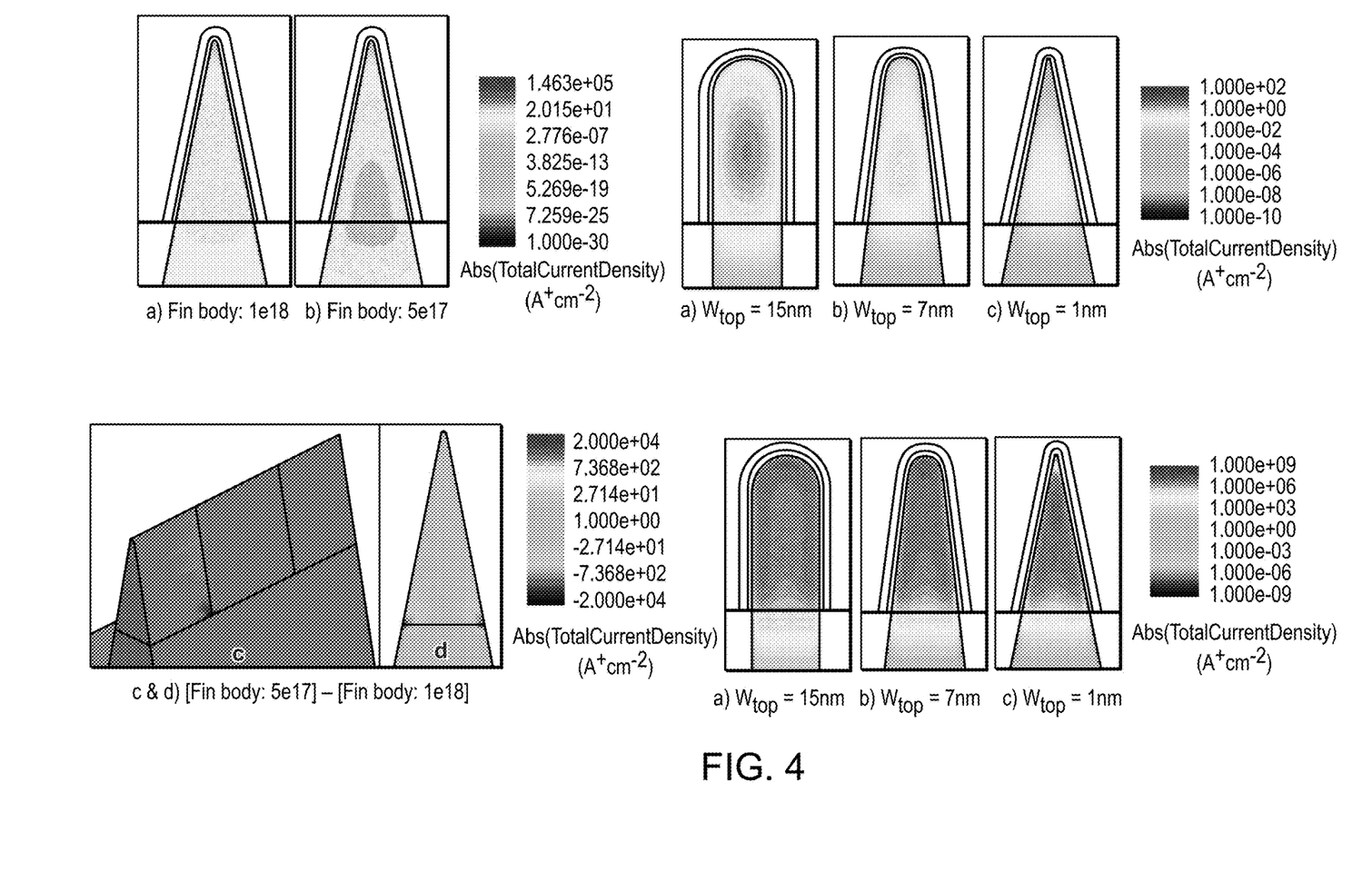
FIG. 4 shows finFETs with rounded corners.

As shown in the cross-section of FIG. 2, the fin 12 in FIG. 1 has an active fin portion 24 that protrudes above the substrate 16 and a fin body 26 that penetrates the oxide layer 14, which thus functions as an isolation trench towards the substrate 16. As shown in FIG. 3, the active fin portion 24 is characterized by a height H, a base width, $W_{bottom}$ and a top width, $W_{top}$. In many embodiments, the corners of the fin's cross-section are rounded, as shown in FIG. 4.

The fin 12 can have a variety of cross-sections, including triangular, and quadrilateral, the latter including square, rectangle, and trapezoid. For convenience, the fin will be referred to by its cross-section, with the understanding that the actual fin 12 is a solid prism formed by extending its cross-section along a line.

In one embodiment, the fin height is 35 nanometers, the base width is 15 nanometers, and the top width is also 15 nanometers. Such a fin would therefore be a rectangular fin. In the case of triangular or trapezoidal fins, the base width would be greater than the top width.

The fin can also be characterized by either one of two complementary angles made between the wall of the active fin portion 24 and the substrate 16. The complementary angle that is inside the fin 12 shall be referred to herein as the "sidewall angle." A rectangular fin will have a ninety-degree sidewall angle. Triangular and trapezoidal fins will have a sidewall angle that is smaller than ninety degrees.

Figure 5:
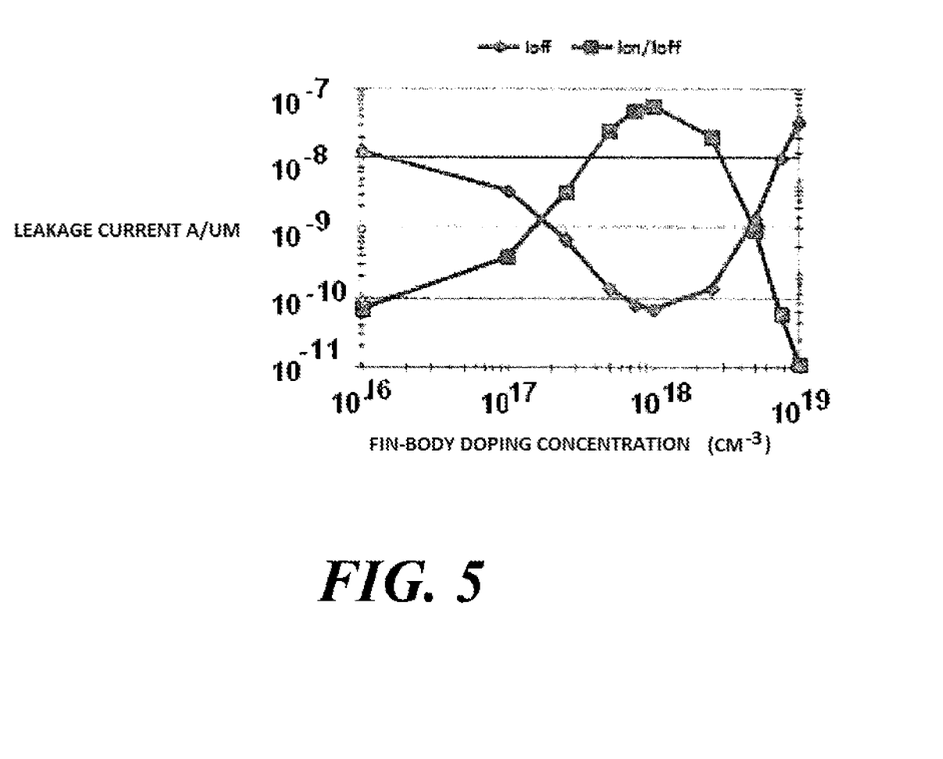
FIG. 5 shows leakage current as a function of body doping concentration.

In general, the active fin portion 24 will be intrinsic to maximize carrier mobility, but the fin body 26 will be doped. The fin body 26 should be doped heavily enough to avoid leakage under the fin 12 that arises from the gate's inability to control short channel effects below the isolation trench 14, but not so heavily as to promote gate induced drain leakage resulting from band-to-band tunneling (BTBT). Thus, if one were to plot leakage current as a function of fin-body doping, the result would have a minimum, as shown in FIG. 5.

To cause the transistor to have a desired electrical parameter, it is useful to first optimize the doping of the fin body 26 and to then select an appropriate fin-geometry. Optimization of doping is generally carried out experimentally, the simplest way being by creating a computer model and sweeping across a range of doping levels. Optimization over fin-geometry can be also be carried out by similar computer modeling techniques. A suitable computer model is implemented by software sold under the name TCAD by Synopsys.

It is also possible to select a fin-geometry and to then choose a doping level that achieves a selected electrical performance parameter for the transistor.

Suitable electrical parameters whose values are selected can include leakage current, drive current, a ratio formed by the foregoing currents, a threshold, or functions thereof.

The methods described herein can be used to conveniently create multi-threshold integrated circuits. In such integrated circuits, different FinFETs have different thresholds. This makes it possible to have low leakage transistors for stand-by functions and high drive-current transistors for operational functions all integrated on the same chip. This advantage arises because all the FinFETs have the same base dimension but different cross-sections and/or fin-body doping levels.

Contrary to the teachings of the prior art, which disclosed that fin-geometry does not affect leakage current, the invention described herein exploits the fact that if the fin base is suitably doped, it is in fact possible to manipulate geometry to control leakage current and other electrical performance characteristics of a FinFET.

The procedure described herein relies on the recognition that achieving a desired FinFET electrical performance involves identifying a point in a two-dimensional optimization space that achieves a particular electrical performance parameter defined along an axis perpendicular to that space. The variables in the two-dimensional optimization space would be fin-body doping level and some geometric parameter, a suitable one being the effective width $W_{\mathit{eff}}$, which is the component of the fin cross section perimeter adjacent to the gate oxide calculated simply using the Pythagorean Theorem for the fin sides and the area of the semi-circle with corner radius set to $W_{top}/2$ for the fin top:

$$W_{\mathit{eff}} = 2\sqrt{\left(\frac{W_{bottom} - W_{top}}{2}\right)^2 + \left(H - \frac{W_{top}}{2}\right)^2} + \pi\frac{W_{top}}{2}$$

Having described the invention, and a preferred embodiment thereof, we now claim, as new, and secured by Letters Patent:

1. A manufacture comprising a plurality of FinFETs integrated into an integrated circuit, wherein each FinFET comprises a fin that protrudes through an oxide layer from a substrate, wherein said fin comprises an active fin portion that protrudes above said substrate and a fin body that penetrates said oxide layer, wherein at least two of said FinFETs have different fin-body doping levels, wherein said FinFETs are bulk FinFETs.

2. The manufacture of claim 1, further comprising a first fin having a first fin-body doping level and a first fin-geometry, and a second fin having a second fin-body doping level and a second fin-geometry, said first and second fins being constituents of corresponding first and second Fin-FETs from said plurality of FinFETs, wherein said first fin-body doping level and said first fin-geometry are selected to achieve a first electrical-performance parameter for said first FinFET, and wherein said second fin-body doping level and said second fin-geometry are selected to achieve a second electrical-performance parameter for said second FinFET, said second electrical-performance parameter differing from said first electrical-performance parameter.

3. The manufacture of claim 2, wherein said first and second fin-geometries are characterized by sidewall angles that differ by a value that is within a range between twenty degrees and an integer multiple of ten degrees.

4. The manufacture of claim 2, wherein said first and second fin-geometries are characterized by different sidewall angles such that a difference between said different sidewall angles is within a sidewall-angle difference range having a lower bound and an upper bound, wherein said lower bound is defined by a product of a differential and a first integer, wherein said upper bound is defined by a product of said differential and a second integer, wherein said second integer is said first integer incremented by one, wherein said differential is ten degrees and said first integer is zero.

5. The manufacture of claim 2, wherein said first and second fin-geometries are characterized by different sidewall angles.

6. The manufacture of claim 2, wherein said first electrical-performance parameter is a parameter that is derived from a combination of leakage current and drive current of said first FINFET, wherein said leakage current and a field strength required to form a conducting channel in said first FinFET are inversely related to each other, wherein said leakage current results in part from leakage under a shallow trench isolation of said first FINFET and gate induced drain leakage associated with band-to-band tunneling at a drain/body interface of said first FINFET.

7. The manufacture of claim 2, wherein said first fin has a cross section having a first side, a second side, and a third side, wherein said first and third sides slope towards each other.

8. The manufacture of claim 2, wherein said first fin has a base dimension that is equal to a base dimension of said second fin.

9. The manufacture of claim 2, wherein said first electrical-performance parameter is drive current, wherein a field strength required to cause formation of a conducting channel in said first FinFET is inversely proportional to leakage current of said first FinFET.

10. The manufacture of claim 2, wherein said first fin has a triangular cross-section.

11. The manufacture of claim 2, wherein said first fin has a transverse cross-section having first, second, and third sides, said first and second sides being joined at a first vertex and said second and third sides being joined at a second vertex.

12. The manufacture of claim 2, wherein said first electrical-performance parameter is indicative of a rate of charge leakage.

13. The manufacture of claim 2, wherein said first fin has a fin axis that extends along said integrated circuit, and wherein, when cut by a plane transverse to said fin axis, said first fin displays a rectangular cross-section.

14. The manufacture of claim 2, wherein a difference between sidewall angles in said first and second fin geometries is within a range having a lower bound and an upper bound, wherein said lower bound is defined by a product of a differential and a first integer, wherein said upper bound is defined by a product of said differential and a second integer, wherein said second integer is said first integer incremented by one, wherein said differential is ten degrees and said first integer is one.

15. The manufacture of claim 2, wherein said first fin has a trapezoidal cross-section.

16. The manufacture of claim 1, wherein at least two of said FinFETs have had fin bodies thereof doped with a dopant, wherein said FinFETs have different fin-body doping levels of said dopant.

17. The manufacture of claim 16, wherein said integrated circuit is a multi-threshold integrated circuit in which at least two of said FinFETs comprise a first FinFET having a first threshold and a second FinFET having a second threshold, wherein said first threshold exceeds said second threshold, wherein a threshold of a FinFET is the field strength that is required to form a conducting channel in said FinFET.

18. The manufacture of claim 17, wherein said first FinFET is used to implement a feature that operates when said integrated circuit is in stand-by mode and said second FinFET is used to implement a feature that operates only when said integrated circuit is actively being used.

19. The manufacture of claim 16, wherein said integrated circuit is a multi-threshold integrated circuit in which at least two of said FinFETs comprise a first FinFET a second FinFET, wherein said first FinFET has a gate, a first region, a second region, and a third region, wherein said first and second regions are doped, wherein said third region is between said first and second regions, wherein application of a field from said gate causes a conducting channel to form in said third region, wherein said field has a first field-strength, wherein said second FinFET has a gate, a first region, a second region, and a third region, wherein said first and second regions are doped, wherein said third region is between said first and second regions, wherein application of a field from said gate causes a conducting channel to form in said third region, wherein said field has a second field-strength, wherein said first field-strength is different from said second field-strength.

20. The manufacture of claim 1, wherein said FinFETs have different thresholds, wherein a threshold is a field strength required to form a conducting channel.

21. A method comprising manufacturing an integrated circuit having a first FinFET and a second FinFET, wherein said first FinFET and said second FinFET have different fin parameters, wherein said fin parameters comprise a fin-body doping level and a fin geometry, wherein manufacturing said integrated circuit comprises selecting an electrical parameter for said first FinFET, identifying a combination of fin parameters that causes said first FinFET to have said electrical parameter, doping said fin body according to said identified fin-body doping, and fabricating said first FinFET according to said fin geometry, selecting an electrical parameter for said second FinFET, identifying a combination of fin parameters that causes said second FinFET to have said electrical parameter, doping said fin body according to said identified fin-body doping, and fabricating said second FinFET according to said fin geometry, wherein said electrical parameter is a desired electrical performance parameter for a FinFET having a fin, wherein said FinFETs in said first and second FinFETs are bulk FinFETs.

22. The method of claim 21, wherein identifying said combination of fin parameters comprises identifying said fin geometry as one having a rectangular cross-section.

23. The method of claim 21, wherein identifying a combination of fin parameters comprises identifying said fin geometry as one having a selected sidewall angle, wherein identifying said fin geometry as one having a selected sidewall angle comprises selecting said selected sidewall angle to be in a range having a lower bound defined by a product of a range breadth and a first integer and an upper bound defined by a product of said range breadth and a second integer, wherein said second integer is equal to said first integer incremented by one, wherein said range breadth is five degrees, and wherein said first integer is three.

24. The method of claim 21, wherein identifying said combination of fin parameters comprises identifying said fin geometry as one having a first side, a second side, and a third side, wherein said first side and said second side meet at a right angle, and wherein said second side and third side meet at a right angle.

25. The method of claim 21, wherein identifying said fin geometry comprises identifying said fin geometry as one having first and second sides that slope toward each other, and a third side having a first end that meets an end of said first side and a second end that meets an end of said second side.

26. The method of claim 21, wherein identifying said fin geometry comprises identifying said fin geometry as one having a trapezoidal cross-section.

27. The method of claim 21, further comprising selecting said electrical parameter to be drive current.

28. The method of claim 21, wherein identifying said fin geometry as one having a rectangular cross-section comprises identifying said fin geometry as one comprising a first side and a second side, both of which have a first length, and a third side having a second length, wherein a first rounded vertex connects said third side to said first side, wherein a second rounded vertex connects said second side to said third side.

29. The method of claim 21, further comprising selecting said electrical parameter to be derived from a combination of leakage current and drive current.

30. The method of claim 21, further comprising selecting said electrical parameter to be leakage current.

31. The method of claim 21, wherein identifying a combination of fin parameters comprises identifying said fin geometry as one having a selected sidewall angle, wherein identifying said fin geometry as one having a selected sidewall angle comprises selecting said selected sidewall angle to be in a range having a lower bound defined by a product of a range breadth and a first integer and an upper bound defined by a product of said range breadth and a second integer, wherein said second integer is equal to said first integer incremented by one, wherein said range breadth is five degrees, and wherein said first integer is two.

32. The method of claim 21, wherein identifying a combination of fin parameters comprises identifying said fin geometry as one having a selected sidewall angle, wherein identifying said fin geometry as one having a selected sidewall angle comprises selecting said selected sidewall angle to be in a range having a lower bound defined by a product of a range breadth and a first integer and an upper bound defined by a product of said range breadth and a second integer, wherein said second integer is equal to said first integer incremented by one, wherein said range breadth is five degrees, and wherein said first integer is one.

33. The method of claim 21, wherein identifying a combination of fin parameters comprises identifying said fin geometry as one having a selected sidewall angle, wherein identifying said fin geometry as one having a selected sidewall angle comprises selecting said selected sidewall angle to be in a range having a lower bound defined by a product of a range breadth and a first integer and an upper bound defined by a product of said range breadth and a second integer, wherein said second integer is equal to said first integer incremented by one, wherein said range breadth is five degrees, and wherein said first integer is four.

34. The method of claim 21, wherein identifying said fin geometry comprises identifying said fin geometry as one having a transverse cross-section that includes a first rounded vertex, a first side, a second rounded vertex, and a second side, said first and second sides having a first length, and a third side that has a second length, wherein said first rounded vertex connects said third side to said first side and wherein said second rounded vertex connects said second side to said third side.

35. The method of claim 21, wherein identifying a combination of fin parameters that causes said first FinFET to have said electrical parameter comprises identifying a point in a two-dimensional optimization space that achieves said electrical parameter, wherein a first dimension of said space is fin-body doping level and a second dimension of said space is a geometric parameter.

36. The method of claim 35, further comprising selecting said geometric parameter to be a component of a perimeter of said fin's cross section that is adjacent to a gate oxide.

37. The method of claim 35, further comprising selecting said geometric parameter to be an effective width of said fin.

38. A method comprising manufacturing an integrated circuit having a first fin body, a second fin body, a first base, a second base, a first fin that extends above said first base, and a second fin that extends above said second base, wherein said first fin has a first geometry and said second fin has a second geometry, wherein said first base and said first fin are constituents of a first FinFET, and wherein said second base and said second fin are constituents of a second FinFET, said method comprising controlling a tradeoff between leakage current and drive current in said first FinFET by controlling both doping of said first fin body and said first geometry without changing a base of said first fin and controlling a tradeoff between leakage current and drive current in said second FinFET by controlling both doping of said second fin body and said second geometry without changing a base of said second fin.

* * * * *